United States Patent
Gillette et al.

[11] Patent Number: 5,831,832
[45] Date of Patent: Nov. 3, 1998

[54] MOLDED PLASTIC BALL GRID ARRAY PACKAGE

[75] Inventors: Joseph G. Gillette, Margate, Fla.; Barry M. Miles, Chandler, Ariz.; Sivakumar Muthuswamy, Plantation, Fla.

[73] Assignee: Motorola, Inc., Schaumburg, Ill.

[21] Appl. No.: 905,009

[22] Filed: Aug. 11, 1997

[51] Int. Cl.⁶ .................................................. H01L 27/00
[52] U.S. Cl. .......................... 361/760; 361/765; 361/764; 361/767; 361/777; 361/783; 361/807; 361/808; 257/778; 257/780; 257/782; 257/737; 257/738
[58] Field of Search ..................... 361/760, 748, 361/761, 764, 765, 767, 777, 783, 807, 808, 768; 257/778, 780, 782, 737, 738, 741, 667, 673, 676, 777

[56] References Cited

U.S. PATENT DOCUMENTS

| | | | |
|---|---|---|---|
| 5,172,303 | 12/1992 | Bernardoni et al. | 361/396 |
| 5,222,014 | 6/1993 | Lin | 361/792 |
| 5,239,198 | 8/1993 | Lin et al. | 257/693 |
| 5,355,283 | 10/1994 | Marrs et al. | 361/760 |
| 5,386,342 | 1/1995 | Rostoker | 361/749 |
| 5,535,101 | 7/1996 | Miles et al. | 367/808 |
| 5,541,450 | 7/1996 | Jones et al. | 257/697 |
| 5,583,378 | 12/1996 | Marrs et al. | 257/710 |
| 5,619,070 | 4/1997 | Kozono | 257/692 |
| 5,739,800 | 4/1998 | Lebby et al. | 345/82 |

OTHER PUBLICATIONS

Advanced IC Packaging Technology uses Polymer for Pins and Housing, Alfred Vollmer, *Electronic Design*, Jun. 9, 1997.

*Primary Examiner*—Leo P. Picard
*Assistant Examiner*—David Foster
*Attorney, Agent, or Firm*—Dale W. Dorinski

[57] ABSTRACT

An improved leadless semiconductor device package consists of a molded plastic carrier (30) with a plurality of C5 bumps (52) integrally molded into the bottom side of the carrier. The bumps are made of the same plastic as the carrier and are monolithic to the carrier. The C5 bumps are coated with a solderable material (50) so that they can be connected to pads on a PCB with solder paste. The top side of the plastic carrier has a metallization pattern containing a plurality of bond pads (44) that correspond to pads on the semiconductor die, and the bond pads are electrically connected to the C5 bumps by an electrically conductive structure. A semiconductor die (38) is mounted on the carrier top side and electrically connected to the plurality of bond pads, either by wire bonds (54) or by flip chip bonding. C4 bumps (70) can also be molded into the carrier for flip chip attachment.

18 Claims, 3 Drawing Sheets

MOLDED PLASTIC BALL GRID ARRAY PACKAGE

TECHNICAL FIELD

This invention relates, in general, to semiconductor packages, and more particularly, to ball grid array semiconductor packaging.

BACKGROUND

Ball grid array (BGA) semiconductor packages are well known in the electronics industry. BGA packages typically comprise a substrate, such as a printed circuit board (PCB), with a semiconductor die having a multitude of bond pads mounted to the top side of the substrate. Wire bonds electrically connect the bond pads to a series of metal traces on the top side of the printed circuit board. This series of metal traces is connected to a second series of metal traces on the back side of the printed circuit board through a series of vias located around the outer periphery of the printed circuit board. The second series of metal traces each terminate with a contact pad where a conductive solder ball is attached. These conductive solder balls are known in the industry as C5 bumps, which is an acronym for Controlled Collapse Chip Carrier Connection. The C5 solder balls are arranged in an array pattern and have a pitch on the order of 1.5 millimeters (mm). Typically, the semiconductor die and wire bonds are encapsulated with a molding compound.

In perimeter BGA packages, the solder balls are arranged on the back side of the printed circuit board between the vias and the semiconductor die. The inner-most conductive solder balls typically are beneath or in close proximity to the outer edges of the semiconductor die, that is, they are not directly underneath the die. In array packages, the solder balls are arranged in a generally regular array that is uniformly distributed across the entire back side of the PCB.

Referring now to FIG. 1, a prior art BGA package 10 comprises a substrate 11 having top conductive traces 12 formed on an upper surface of the substrate. Substrate 11 typically is formed from an organic epoxy-glass resin based material, such as bismaleimide-triazine (BT) resin or FR-4 board. Bottom conductive traces 13 are formed on a lower surface of substrate 11 and are electrically connected to the top conductive traces through vias or plated throughholes 14. Vias 14 extend from the upper surface of the substrate to the lower surface, and contain a conductive material such as copper. The top conductive traces 12 terminate with bond pads 21, and the bottom conductive traces 13 terminate with terminal pads 16. Top conductive traces 12, bottom conductive traces 13, terminal pads 16, and bond pads 21 comprise an electrically conductive material such as copper or copper plated with gold. Only a portion of each of these elements are shown in order to avoid overcrowding the drawing.

BGA package 10 is used to house an integrated circuit or semiconductor die 18 attached to a die attach pad 23 on the upper surface of the substrate. The semiconductor die is attached to the die attach pad with an epoxy. The semiconductor die has a plurality of bonding or bond pads 22 formed on an upper surface, and each of the bond pads is electrically connected to the top conductive traces 12 with a wire bond 19. Typically, semiconductor die 18, wire bonds 19, and a portion of substrate 11 are covered by an encapsulant 24. Conductive solder balls 26 are each attached to the terminal pads 16, and are spaced a pitch 27 apart, which is typically on the order of 1.0 to 1.8 mm. The inner-most conductive solder balls 26 are typically underneath or adjacent to the semiconductor die. The number and arrangement of conductive solder balls 26 on the lower surface of substrate 11 depends on circuit requirements including input/output (I/O), power and ground connections. Solder balls 26 are metallurgically fused to the terminal pads by a reflow process. The solder balls are later connected to a next level of assembly or printed circuit board (PCB) 28 using a standard solder reflow process to form solder joints 25. After the mounting process, solder joints 25 take a flattened spherical shape defined by solder volume and wetting areas.

This type of BGA package 10 has several disadvantages, including: a high profile with a height on the order of 2.4 mm. or more; collapse of the solder balls at reflow to a height determined by ball and ball pad size; a fatigue failure rate of the solder joints during temperature cycling due to the high strain levels in solder joints with lower height to diameter ratios; the semiconductor die imparts significant stress on those solder balls directly beneath or in close proximity to the outer edge of the die when the BGA package is mounted to a PCB and subjected to temperature cycling, and can ultimately result in solder joint failure; and, since the solder balls are placed on each individual solder pad on the PCB in a separate step, this process can be one of the more costly ones in providing the package. Although the BGA package 10 is shown in perimeter design, BGA packages with solder balls all across the lower surface of the substrate and directly below the semiconductor die share at least some of the same disadvantages.

Users of BGA packages, particularly in computer, communication, and personal electronic applications, are demanding smaller, lighter and thinner (less than 1.5 mm) BGA packages to support, among other things, portability. Furthermore, users are pushing for BGA packages that are more reliable under increasingly demanding operating conditions, and that are lower cost. Accordingly, there exists a need for a BGA package that answers the electronics industry's demand for low-profile (less than 1.5 mm), that has a reduced susceptibility to solder reflow collapse, that has a reduced rate of solder joint failure under temperature cycling, that has increased I/O density, and that is cost effective.

DETAILED DESCRIPTION OF THE PREFERRED EMBODIMENT

An improved leadless semiconductor device package consists of a molded plastic carrier with a plurality of C5 bumps integrally molded into the bottom side of the carrier. The bumps are made of the same plastic as the carrier, and are actually a part of the carrier. That is, they are not a separate part or component that is added later, as in the case of the solder balls used in the prior art. Most, if not all, of the C5 bumps are coated with a solderable material so that they can later be connected to pads on a PCB with solder paste. The top side of the plastic carrier has a metallization pattern containing a plurality of bond pads that correspond to pads on the semiconductor die, and these bond pads are electrically connected to the C5 bumps by a conductive structure. The semiconductor die is mounted on the carrier top side and electrically connected to the plurality of bond pads, either by wire bonds or by flip chip bonding.

Figure 1:
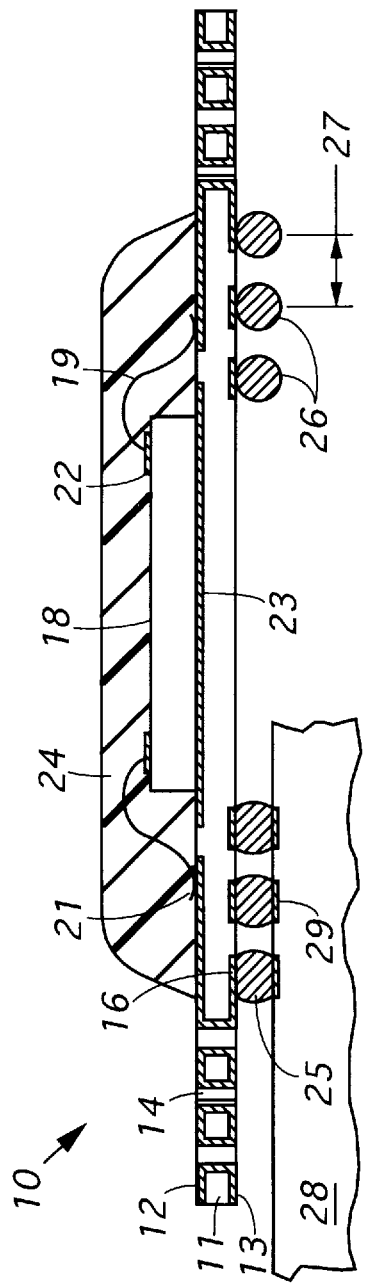
FIG. 1 is a cross-sectional view of a prior art perimeter BGA package.
Figure 2:
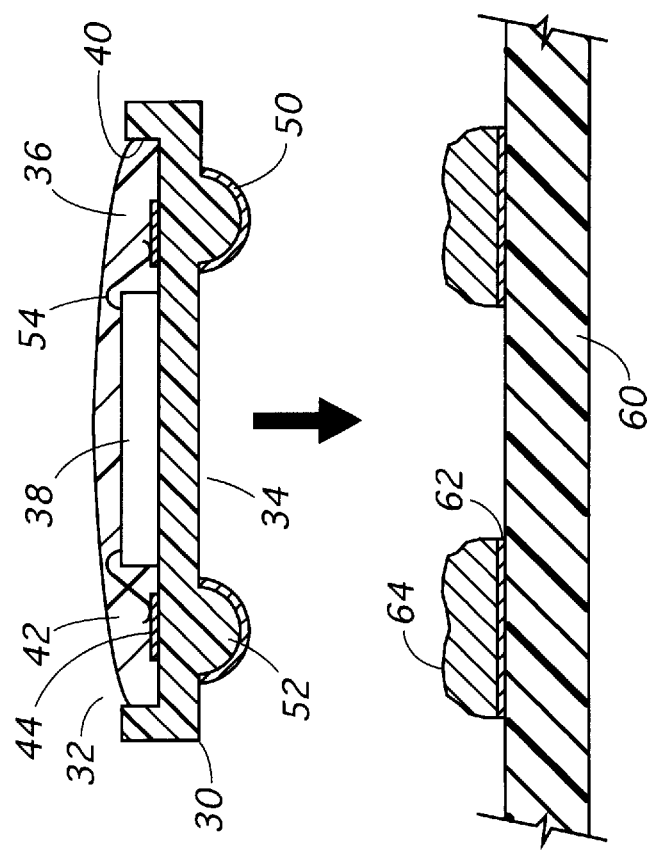
FIG. 2 is a cross-sectional view of a molded plastic semiconductor device package in accordance with our invention.

FIG. 2 illustrates a cross-sectional view of one embodiment of this improved BGA package according to our present invention. At the heart of the structure is a molded plastic carrier 30. This carrier is formed by molding (injection, transfer, thermoform, reaction-injection molding, etc.) a plastic material into a mold. Some useful materials for the carrier include polyetherimide, polyimide, polyamide, epoxy, polyurethane, polysulfone, polyphenylenesulphide and melamines. Molding the carrier is accomplished by any number of traditional methods well known to those in the molding arts. The molded plastic carrier 30 has a number of features, including a top side 32 and an opposing bottom side 34. A recessed cavity area 36 is formed in the top side to receive a semiconductor die 38. On the top side, and generally in the cavity, is a metallization pattern comprising, among other things, a group of bonding pads 44 that generally correspond to the bond pads on the semiconductor die. The metallization pattern also contains additional routing traces (not shown for sake of clarity) that aid in connecting the bonding pads 44 to metallization 50 on the molded-in C5 bumps 52. Connection from the top side to the bottom side can be made in a variety of ways, for example, by plated through holes or vias, by solid vias, by conductive wires, or by routing the conductors around the edge of the carrier. The C5 bumps 52 are formed as an integral part of the molded plastic carrier 30. That is, in contrast to the conventional art where solder balls are placed on a PCB material and then fused by heating, the C5 bumps in our carrier are actually a part of the carrier, molded in as part of the carrier during the molding process. The C5 bumps 52 and the carrier substrate 30 are a single, monolithic structure. Although the drawing figure depicts the C5 bumps as hemispheres, and one generally associates the term 'bump' with a rounded shape, the C5 bumps 52 can be formed in a variety of shapes. For example, they can be shaped as a dome, cylindrical column, pedestal, stud, post, hourglass, or pyramid. Overlying most or all of the C5 bumps is a solderable metal coating 50 that is used to attach the molded plastic semiconductor device package to solder pads 62 on a main PCB 60. In practice, solder paste 64 is applied on the main PCB solder pads 62, and the molded plastic semiconductor device package is then reflow soldered to the PCB 60 by conventional means.

The bond pads on the semiconductor die are electrically connected to the corresponding bonding pads 44 on the molded plastic carrier by means of wirebonds 54 in the preferred embodiment. Surrounding the cavity 36 is an elevated peripheral border 40, which, in the preferred embodiment, also serves as the outer edge of the plastic carrier. However, this border may also be placed substantially inboard of the edge, if desired. In practice, the border 40 also acts as a dam to contain the spread of an encapsulant 42 which is applied over the die 38 and associated wirebonds 54. The encapsulant 42 is typically a glob top encapsulant. As the molded cavity of the carrier forms a natural barrier for the encapsulation liquid, a low viscosity material can be used, enabling a wide process window and minimizing the amount of encapsulant needed. Since the die is mounted in a cavity, the overall thickness of the package is very small.

Figure 3:
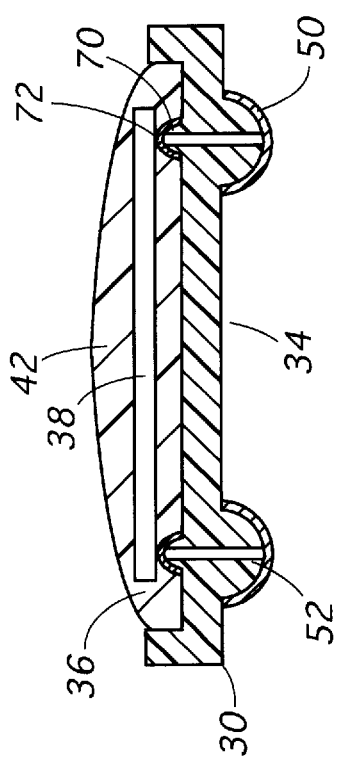
FIG. 3 is a cross-sectional view of an alternate embodiment of a molded plastic semiconductor device package in accordance with our invention, showing flip chip attachment.

In an alternate embodiment of the invention depicted in FIG. 3, the die 38 is attached to the molded plastic carrier 30 by flip chip methods. Flip chip attachment is well known in the art, and is generally accomplished by bumping the die with C4 bumps, one on each die bond pad. C4 is an acronym for Controlled Collapse Chip Connection. However, our invention obviates the need for bumping the die by molding the C4 bumps 70 into the carrier 30 during the injection molding step. This eliminates the costly and arduous step of wafer bumping. Like the C5 bumps on the bottom of the carrier, the C4 bumps have a metal coating 72 over them that allows for connection to corresponding die bond pads on the semiconductor device. However, unlike the C5 bumps, this C4 coating 72 does not have to be solderable, since the connection to the chip can be made by conductive adhesives, gold eutectic bonding, etc. The C4 bumps are disposed in the die mounting area of the cavity 36, and the metallization coating 72 is connected to the metallization 50 on the C5 bumps 52 by methods similar to that used in the previous embodiment. The spacing on the C4 bumps is typically less than the spacing of the C5 bumps. Although an encapsulant 42 is shown in the figure to protect the die, since the die is flip chip mounted, the encapsulant is optional, and may be eliminated to further reduce the height of the assembly.

Figure 4:
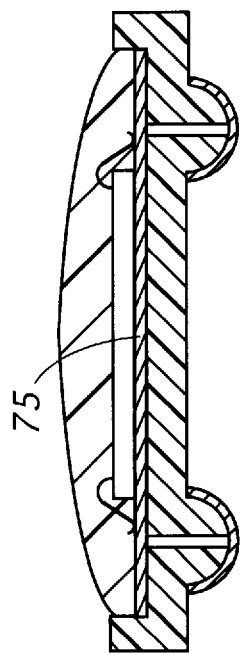
FIG. 4 is a cross-sectional view of another embodiment of a molded plastic semiconductor device package in accordance with our invention.

In still another embodiment of the invention shown in FIG. 4, a rigidizer 75 can be added to the structure to modify the mechanical or thermal properties of the package. The rigidizer 75 also aids in the wirebonding process, as plastic materials are known to absorb some of the ultrasonic energy used to make the wire bond. In this case, appropriate metallization is placed on the rigidizer to provide the required electrical connection between the die and the C5 bumps.

In summary, with this type of molded C5 bump, the I/O spacing can be much closer than in conventional packages using solder balls, as the bumps can be molded with great precision in the molding process. The costly step of adding solder balls to the solder pads to create the necessary bumps is eliminated. Further, the height of the bumps is predictable. Mechanical strain caused by the thermal mismatch between the package and the PCB is relieved. In other words, the coefficient of expansion of a plastic C5 bump more closely matches that of the PCB, so there is less stress between the PCB and the package that could break the connection between them. In contrast to a conventional BGA, no solder balls are required, even though our package has similar characteristics. This package also offers a higher packaging density and delivers a price advantage. The ability to mold the C4 bumps into the carrier also eliminates the costly wafer bumping process.

While the preferred embodiments of the invention have been illustrated and described, it will be clear that the invention is not so limited, and other equivalents will occur to those skilled in the art without departing from the spirit and scope of the present invention as defined by the appended claims.

What is claimed is:

1. A leadless semiconductor device package for mounting to a printed circuit board, comprising:
   a molded plastic carrier having a top side for receiving a semiconductor die and a bottom side having a plurality of bumps integrally molded into the carrier and made of the same plastic as the carrier, most of the integrally molded bumps having a solderable metal coating thereon;
   the carrier top side having a metallization pattern containing a plurality of bond pads that correspond to pads on the semiconductor die, the bond pads electrically connected to the integrally molded bumps by a conductive structure; and the semiconductor die mounted on the carrier top side and electrically connected to the plurality of bond pads.

2. The leadless semiconductor device package as described in claim 1, further comprising an encapsulant covering the semiconductor die.

3. The leadless semiconductor device package as described in claim 2, wherein the encapsulant is glob top.

4. The leadless semiconductor device package as described in claim 2, wherein the carrier top side comprises a recessed cavity containing a die mounting area.

5. The leadless semiconductor device package as described in claim 4, further comprising a dam to contain the encapsulant, said dam integrally molded into the top side of the plastic carrier.

6. The leadless semiconductor device package as described in claim 1, wherein the semiconductor die is flip chip mounted to the carrier.

7. The leadless semiconductor device package as described in claim 1, wherein the semiconductor die is wire bonded to the carrier.

8. The leadless semiconductor device package as described in claim 1, further comprising a metal rigidizer disposed on the carrier top side, the semiconductor die mounted directly onto the rigidizer.

9. The leadless semiconductor device package as described in claim 1, wherein the conductive structure comprises metal leads that are integrally molded in to the plastic carrier.

10. The leadless semiconductor device package as described in claim 1 wherein the conductive structure comprises conductive vias.

11. The leadless semiconductor device package as described in claim 1 wherein the integrally molded bumps are shaped as a hemisphere, dome, cylindrical column, pedestal, stud, post, hourglass, or pyramid.

12. A leadless semiconductor device package for mounting to a printed circuit board, comprising:

a molded plastic carrier having a top side and a bottom side;

the top side having a recessed cavity for receiving a semiconductor die, and having a metallization pattern containing a plurality of bond pads that correspond to pads on the semiconductor die;

the bottom side having a plurality of bumps integrally molded into the carrier and made of the same plastic as the carrier, most of the integrally molded bumps having a solderable metal coating thereon;

the bond pads electrically connected to the integrally molded bumps by a conductive structure;

the semiconductor die mounted in the recessed cavity and electrically connected to the bond pads; and a glob top encapsulant covering the semiconductor die.

13. A leadless semiconductor device package for mounting to a printed circuit board, comprising:

a molded plastic carrier having a top side for receiving a semiconductor die and a bottom side having a plurality of bumps integrally molded into the carrier and made of the same plastic as the carrier, most of the integrally molded bumps having a solderable metal coating thereon;

the carrier top side having a plurality of C4 bumps that correspond to pads on the semiconductor die, the C4 bumps integrally molded into the carrier top side and made of the same plastic as the carrier, each of the C4 bumps having a solderable metal coating thereon;

the C4 bumps electrically connected to the integrally molded bumps by a conductive structure; and the semiconductor die flip chip mounted to the C4 bumps.

14. The leadless semiconductor device package as described in claim 13, further comprising an encapsulant covering the semiconductor die.

15. The leadless semiconductor device package as described in claim 14, wherein the encapsulant is glob top.

16. The leadless semiconductor device package as described in claim 13, wherein the C4 bumps are disposed in a recessed cavity comprising a die mounting area.

17. The leadless semiconductor device package as described in claim 16, further comprising a dam to contain the encapsulant, said dam integrally molded into the top side of the plastic carrier.

18. A leadless semiconductor device package for mounting to a printed circuit board, comprising:

a molded plastic carrier having a top side for receiving a semiconductor die and a bottom side having a plurality of bumps shaped as a hemisphere, dome, cylindrical column, pedestal, stud, post, hourglass, or pyramid and integrally molded into the carrier and made of the same plastic as the carrier, most of the integrally molded bumps having a solderable metal coating thereon;

the carrier top side having a plurality of C4 bumps that correspond to pads on the semiconductor die, the C4 bumps shaped as a hemisphere, dome, cylindrical column, pedestal, stud, post, hourglass, or pyramid and integrally molded into the carrier top side and made of the same plastic as the carrier, each of the C4 bumps having a solderable metal coating thereon;

the C4 bumps electrically connected to the integrally molded bumps by a conductive structure: and the semiconductor die flip chip mounted to the C4 bumps.

* * * * *